(12) United States Patent
Kraft et al.

(10) Patent No.: US 11,764,109 B2
(45) Date of Patent: Sep. 19, 2023

(54) METHOD OF FORMING A THROUGH-SUBSTRATE VIA AND A SEMICONDUCTOR DEVICE COMPRISING A THROUGH-SUBSTRATE VIA

(71) Applicant: ams AG, Premstaetten (AT)

(72) Inventors: Jochen Kraft, Eindhoven (NL); Georg Parteder, Eindhoven (NL); Stefan Jessenig, Eindhoven (NL); Franz Schrank, Eindhoven (NL); Jörg Siegert, Eindhoven (NL)

(73) Assignee: AMS AG, Premstätten (AT)

( * ) Notice: Subject to any disclaimer, the term of this patent is extended or adjusted under 35 U.S.C. 154(b) by 63 days.

(21) Appl. No.: 16/980,197

(22) PCT Filed: Apr. 3, 2019

(86) PCT No.: PCT/EP2019/058430
§ 371 (c)(1),
(2) Date: Sep. 11, 2020

(87) PCT Pub. No.: WO2019/193067
PCT Pub. Date: Oct. 10, 2019

(65) Prior Publication Data
US 2021/0020511 A1      Jan. 21, 2021

(30) Foreign Application Priority Data
Apr. 4, 2018 (EP) .................................... 18165692

(51) Int. Cl.
*H01L 29/40* (2006.01)
*H01L 21/768* (2006.01)
*H01L 23/48* (2006.01)

(52) U.S. Cl.
CPC ...... *H01L 21/76898* (2013.01); *H01L 23/481* (2013.01)

(58) Field of Classification Search
CPC .................... H01L 21/76898; H01L 23/481
See application file for complete search history.

(56) References Cited

U.S. PATENT DOCUMENTS

| | | | |
|---|---|---|---|
| 9,633,929 B2 * | 4/2017 | Yang | ..................... H01L 21/288 |
| 11,069,597 B2 * | 7/2021 | Lee | .................. H01L 23/53295 |

(Continued)

FOREIGN PATENT DOCUMENTS

| | | |
|---|---|---|
| DE | 102008033395 | 2/2010 |
| EP | 2634795 | 9/2013 |

(Continued)

OTHER PUBLICATIONS

European Patent office, International Search Report for PCT/EP2019/058430 dated Jun. 4, 2019.

*Primary Examiner* — Victor A Mandala
*Assistant Examiner* — Colleen E Snow
(74) *Attorney, Agent, or Firm* — MH2 TECHNOLOGY LAW GROUP LLP

(57) ABSTRACT

A substrate is provided with a dielectric, a metal layer embedded in the dielectric, and a metallic layer arranged on the metal layer between the substrate and the metal layer. A via hole is formed in the substrate and in a region of the dielectric that is between the substrate and the metal layer. An insulation layer is applied in the via hole and removed from above a contact area of the metal layer, and the metallic layer is completely removed from the contact area. A metallization is applied in the via hole on the contact area.

11 Claims, 9 Drawing Sheets

(56) References Cited

U.S. PATENT DOCUMENTS

| | | |
|---|---|---|
| 2011/0237073 A1 | 9/2011 | Dao et al. |
| 2012/0104563 A1 | 5/2012 | Saito |
| 2013/0313688 A1 | 11/2013 | Nomura |
| 2014/0312468 A1 | 10/2014 | Chen et al. |
| 2015/0102497 A1 | 4/2015 | Park et al. |

FOREIGN PATENT DOCUMENTS

| | | |
|---|---|---|
| EP | 2790211 | 10/2014 |
| EP | 3312874 | 4/2018 |
| JP | 2014-103137 | 6/2014 |
| WO | 2010/006916 | 1/2010 |

* cited by examiner

METHOD OF FORMING A THROUGH-SUBSTRATE VIA AND A SEMICONDUCTOR DEVICE COMPRISING A THROUGH-SUBSTRATE VIA

BACKGROUND OF THE INVENTION

A through-substrate via is an electric interconnection through a semiconductor substrate. It comprises a via hole penetrating the substrate and a metallization arranged in the via hole.

A through-substrate via can be produced by first forming a metal layer in a dielectric material above a main surface of the substrate. Layers of a different metallic material covering the metal layer improve the adhesion of the dielectric material. Then a via hole is etched from the opposite surface through the substrate, until the dielectric material is reached. A silicon oxide layer, which is provided as an insulation, is arranged on the sidewall and the bottom of the via hole. The silicon oxide and the dielectric material are removed from the bottom of the via hole by an anisotropic etching step, so that the silicon oxide remains on the sidewall to cover the semiconductor material, and a contact area of the metal layer is exposed at the bottom. A metallization is applied in the via hole, so that it contacts the metal layer and forms the electric interconnection.

US 2015/0102497 A1 discloses a method of producing integrated circuit devices including a through-silicon via. A landing pad is formed by a metal layer of Cu, W, Ta, Ti, Co, Mn, Al or a combination thereof and by a barrier film of Ta, Ti, TaN, TiN, AlN, WN or a combination thereof.

SUMMARY OF THE INVENTION

The method of forming a through-substrate via comprises providing a substrate with a dielectric arranged on the substrate, a metal layer embedded in the dielectric, and a metallic layer arranged on the metal layer, the metallic layer being disposed between the substrate and the metal layer. A via hole is formed penetrating the substrate above the metal layer. An insulation layer is applied in the via hole and removed from above a contact area of the metal layer. A metallization is applied in the via hole, the metallization contacting the metal layer in the contact area and being insulated from the substrate by the insulation layer. The metallic layer is completely removed from the contact area before the metallization is applied.

In a variant of the method, the dielectric is removed from above the contact area after the insulation layer is applied and removed from above the contact area.

In a further variant of the method, before the insulation layer is applied, the dielectric is removed from above the metallic layer, so that the via hole reaches the metallic layer, the insulation layer is applied on the metallic layer, and the insulation layer is removed from above the contact area such that a portion of the metallic layer is left between the metal layer and the insulation layer.

In a further variant of the method, before the insulation layer is applied, the dielectric and the metallic layer are removed from above the metal layer, so that the via hole reaches the metal layer and the contact area of the metal layer is exposed inside the via hole, and the insulation layer is applied on the metal layer. After the insulation layer is removed from above the contact area, the metallization is applied in electric contact with the contact area and insulated from the metallic layer by the insulation layer.

In a further variant of the method, the dielectric is removed from above the metal layer by etching and by using a recipe that is non-selective with respect to the metallic layer.

In a further variant of the method, the dielectric and the insulation layer are removed from above the metal layer by etching, and in each of these etching steps the same etching recipe is used.

In a further variant of the method, a mask with an opening is applied before the via hole is formed. The via hole is etched through the opening, and the mask is removed before the insulation layer is applied.

The metal layer may comprise a material that is different from the material of the metallic layer. The metal layer may be aluminum, for instance. The metallic layer may comprise titanium or aluminum, for instance. The metallic layer may also comprise a nitride.

The semiconductor device comprises a substrate with a through-substrate via, a via hole of the through-substrate via, an insulation layer in the via hole, a metallization of the through-substrate via, the insulation layer insulating the metallization from the substrate, a metal layer above the substrate, the metallization contacting the metal layer, a metallic layer on the metal layer, the metallic layer being arranged between the substrate and the metal layer, the metallic layer comprising a material that is different from the material of the metal layer, and the metallization being in contact with a contact area of the metal layer.

In an embodiment of the semiconductor device, a portion of the metallic layer is arranged between the metal layer and the insulation layer.

In a further embodiment of the semiconductor device, the metallization is completely separated from the metallic layer by the insulation layer.

In a further embodiment of the semiconductor device, the metallic layer comprises titanium or aluminum.

In a further embodiment of the semiconductor device, the metallic layer comprises a nitride.

The following is a detailed description of examples of the method and the device in conjunction with the appended figures.

DETAILED DESCRIPTION

Figure 1:
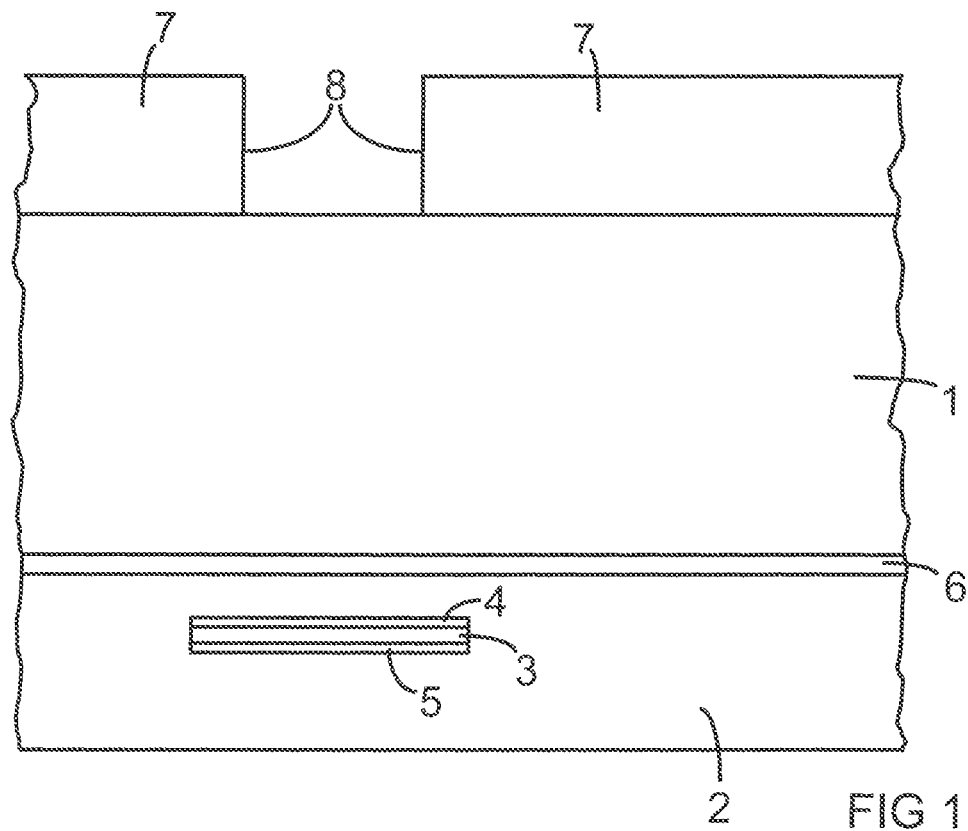
FIG. 1 is a cross section of an intermediate product before the via hole is etched.

FIG. 1 is a cross section of an example of an intermediate product that may be obtained with the method. A substrate 1 of semiconductor material, which may be silicon, for instance, is provided with a dielectric 2, which may especially be an intermetal dielectric like silicon oxide, for instance. A further dielectric 6, which is different from the dielectric 2, may optionally be arranged between the substrate 1 and the dielectric 2.

A metal layer 3 is embedded in the dielectric 2. The metal layer 3 may especially be part of a wiring, which may comprise several metal layers, for instance. Details of such a wiring, which is known per se from CMOS technology, are not relevant to the invention and are not represented in the figures. The metal layer 3 may especially be aluminum, for example.

A metallic layer 4 is arranged on the main surface of the metal layer 3 that faces the substrate 1. An optional further metallic layer 5 may be arranged on the main surface of the metal layer 3 that faces away from the substrate 1. The metallic layer 4 and/or the further metallic layer 5 may especially comprise titanium or aluminum. In particular, the metallic layer 4 and/or the further metallic layer 5 may comprise titanium nitride or aluminum nitride, for instance.

Metal layers of a wiring, which are embedded in an intermetal dielectric, are conventionally provided with coverings of titanium nitride, in particular in CMOS technology, in order to enhance the adhesion of the dielectric material to the metal layers. The metal layer 3, the metallic layer 4 and the further metallic layer 5 may be applied as part of such a wiring.

A mask 7, which may be a resist mask or a hardmask, for instance, is applied on the backside of the substrate 1, opposite the dielectric 2. The mask 7 has an opening 8 opposite the metal layer 3 and above the region where the through-substrate via is to be formed.

Figure 2:
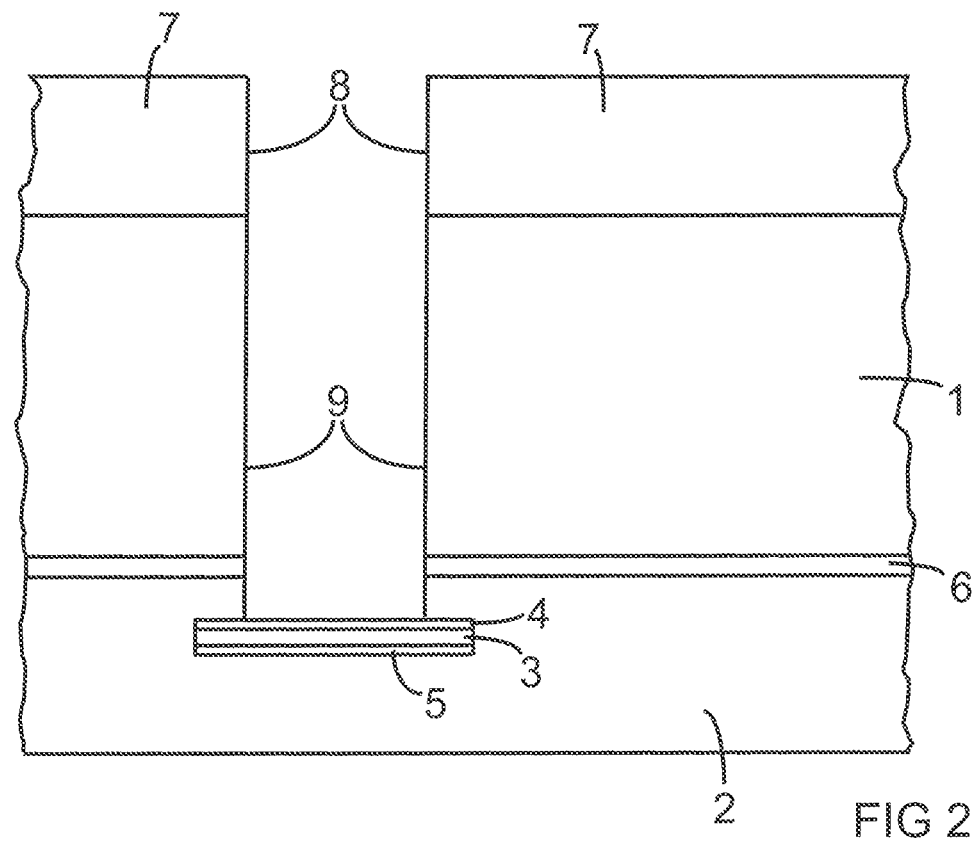
FIG. 2 is a cross section according to FIG. 1 after the via hole is etched.

FIG. 2 is a cross section according to FIG. 1 and shows a further intermediate product after the formation of a via hole 9. The via hole 9 is etched in the substrate 1 through the opening 8 of the mask 7. Etching is continued through the dielectric 2, 6 until the metallic layer 4 is reached. The mask 7 is still present while the dielectric 2, 6 is etched. The metallic layer 4 may be used as an etch stop layer terminating the etching of the dielectric 2, 6.

Figure 3:
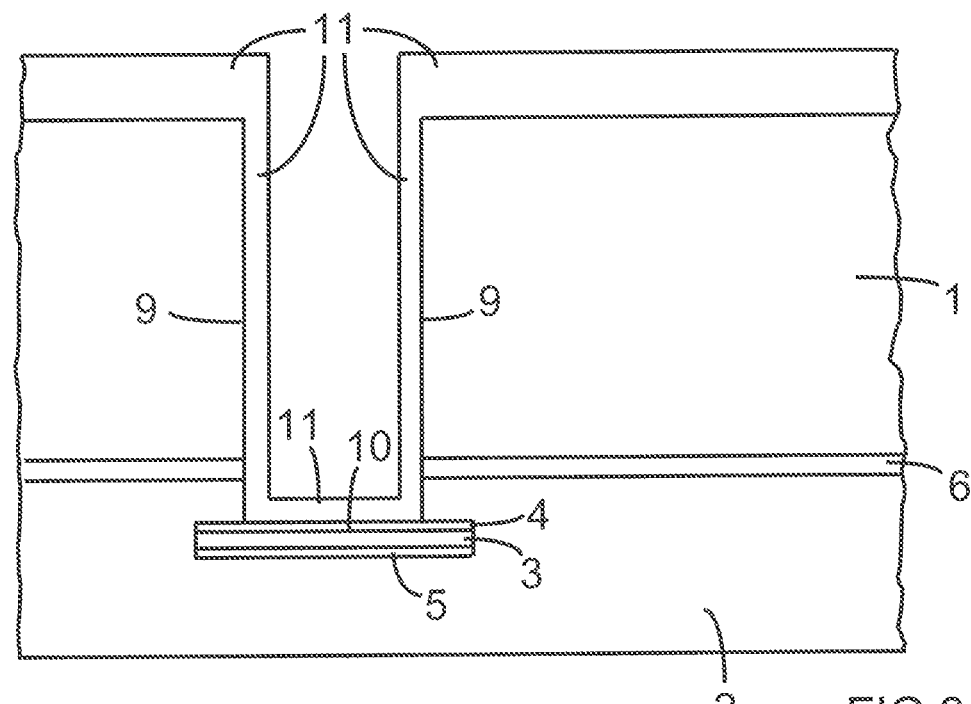
FIG. 3 is a cross section according to FIG. 2 after an application of an insulation layer.

FIG. 3 is a cross section according to FIG. 2 and shows a further intermediate product after an application of an insulation layer 11. The insulation layer 11, which may be silicon oxide, for instance, is provided as an insulation between the semiconductor material of the substrate 1 and the metallization that will later be applied to form the electrically conductive part of the through-substrate via. The insulation layer 11 may be applied by deposition, for example. Portions of the insulation layer 11 may typically also cover the contact area 10 of the metal layer 3 and the backside of the substrate 1 outside the via hole 9.

Figure 4:
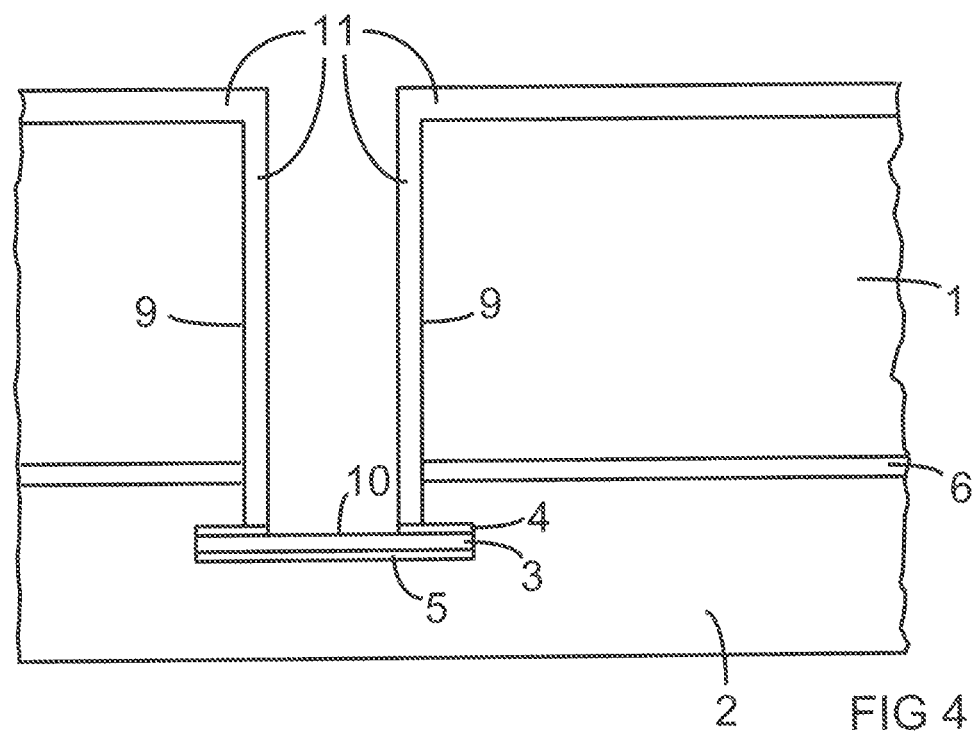
FIG. 4 is a cross section according to FIG. 3 after the insulation layer is removed from the bottom of the via hole.

FIG. 4 is a cross section according to FIG. 3 and shows a further intermediate product after a partial removal of the insulation layer 11. An anisotropic etching process, which is also known per se from the etching of spacers, is applied to remove the insulation layer 11 from the bottom of the via hole 9, where the metallic layer 4 is exposed. The metallic layer 4 is also partially removed, so that the contact area 10 of the metal layer 3 is exposed. The portion of the insulation layer 11 that is applied outside the via hole 9 may be completely removed. Instead, as shown in FIG. 4 by way of example, the backside of the substrate 1 may still be covered by the insulation layer 11.

Figure 5:
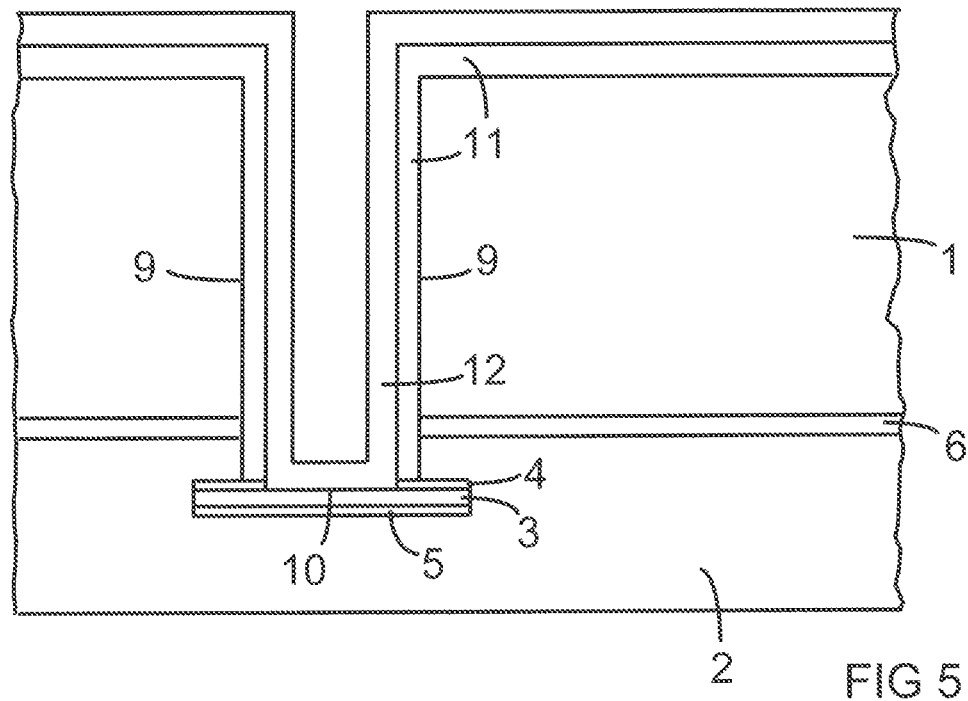
FIG. 5 is a cross section according to FIG. 4 after an application of a metallization.

FIG. 5 is a cross section according to FIG. 4 and shows a further intermediate product after an application of a metallization 12, which is provided for the electrically conductive part of the through-substrate via. The metallization 12 can be applied as a layer, especially a conformal layer. It is applied on the contact area 10 of the metal layer 3, so that it is in electric contact with the contact area 10. Thus an electric connection is formed from the metal layer 3 to the backside of the substrate 1. The metallization 12 may comprise more than one metal and may especially be applied as a sequence of metal layers, which may include titanium and tungsten layers, for instance. The metallization 12 contacts the remaining portion of the metallic layer 4 below the bottom of the insulation layer 11.

Figure 6:
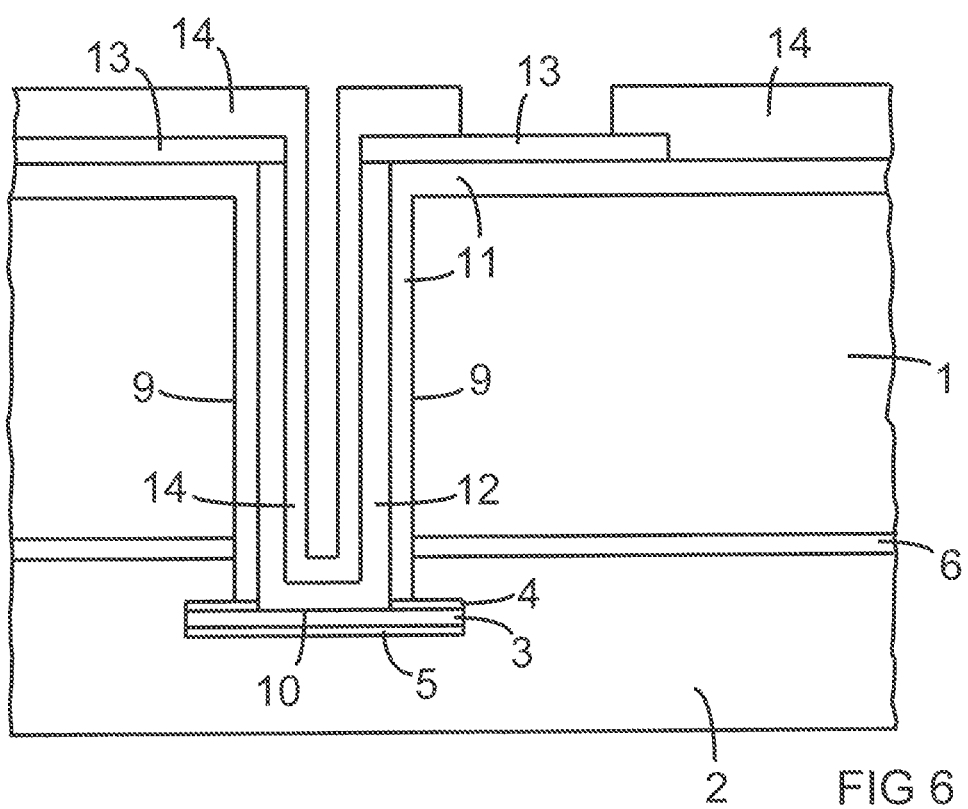
FIG. 6 is a cross section according to FIG. 5 after an application of a top metal.

FIG. 6 is a cross section according to FIG. 5 after further process steps. The metallization 12 is optionally removed from the backside of the substrate 1, and a top metal 13 may be applied on the backside and in contact with the metallization 12. In this way a redistribution layer, for example, may be formed on the backside. The top metal 13 may be covered with a cover layer 14, which may be a further dielectric, for instance. At least one opening in the cover layer 14 may provide access to the top metal 13 for the purpose of applying a bump contact, for example, or a similar external electric terminal. Details of the electric conductors that may be formed on the backside are not relevant to the invention and are not shown in FIG. 6.

Figure 7:
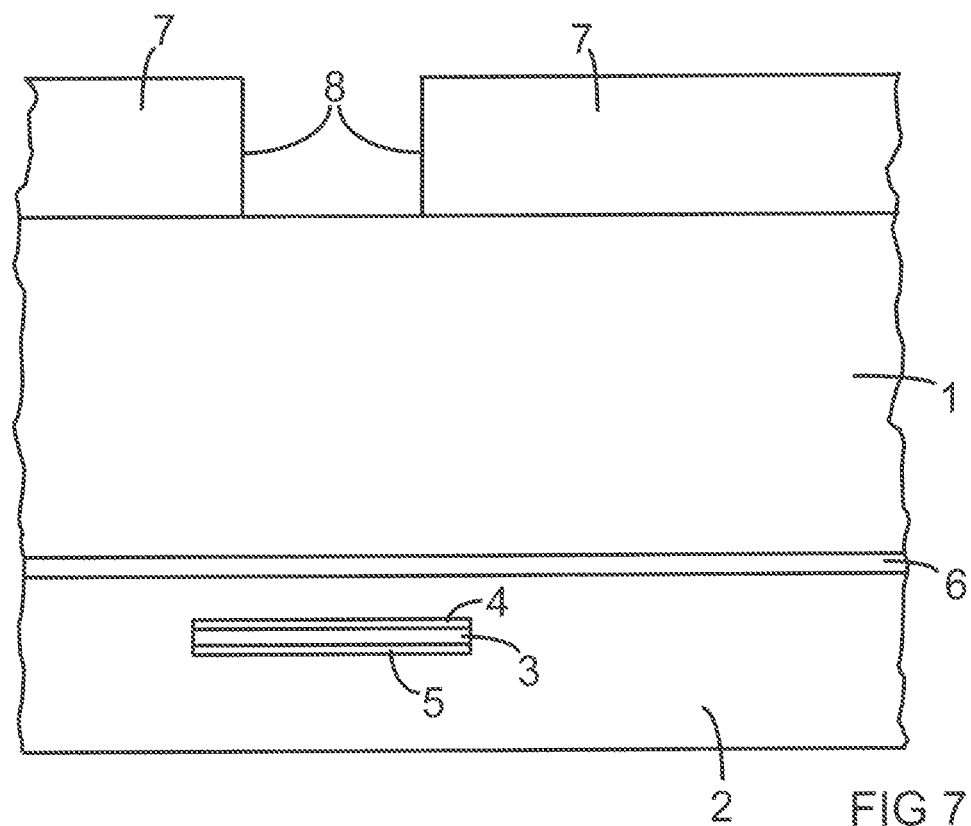
FIG. 7 is a cross section of an intermediate product of an alternative method before the via hole is etched.

FIGS. 7 to 12 are cross sections according to FIGS. 1 to 6 for a variant of the method. FIG. 7 shows the intermediate product corresponding to the intermediate product shown in FIG. 1. The corresponding elements are designated with the same reference numerals. A substrate 1 of semiconductor material like silicon, for instance, is provided with a dielectric 2 and with a metal layer 3 embedded in the dielectric 2, as described in conjunction with FIG. 1. The metallic layer 4 is arranged on the metal layer 3 on the surface facing the substrate 1, and an optional further metallic layer 5 may be arranged on the opposite surface of the metal layer 3. The metallic layer 4 and/or the further metallic layer 5 may especially comprise titanium or aluminum, in particular titanium nitride or aluminum nitride, for instance.

A mask 7, which may be a resist mask or a hardmask, for instance, is applied on the backside of the substrate 1, opposite the dielectric 2. The mask 7 has an opening 8 opposite the metal layer 3 and above the region where the through-substrate via is to be formed.

Figure 8:
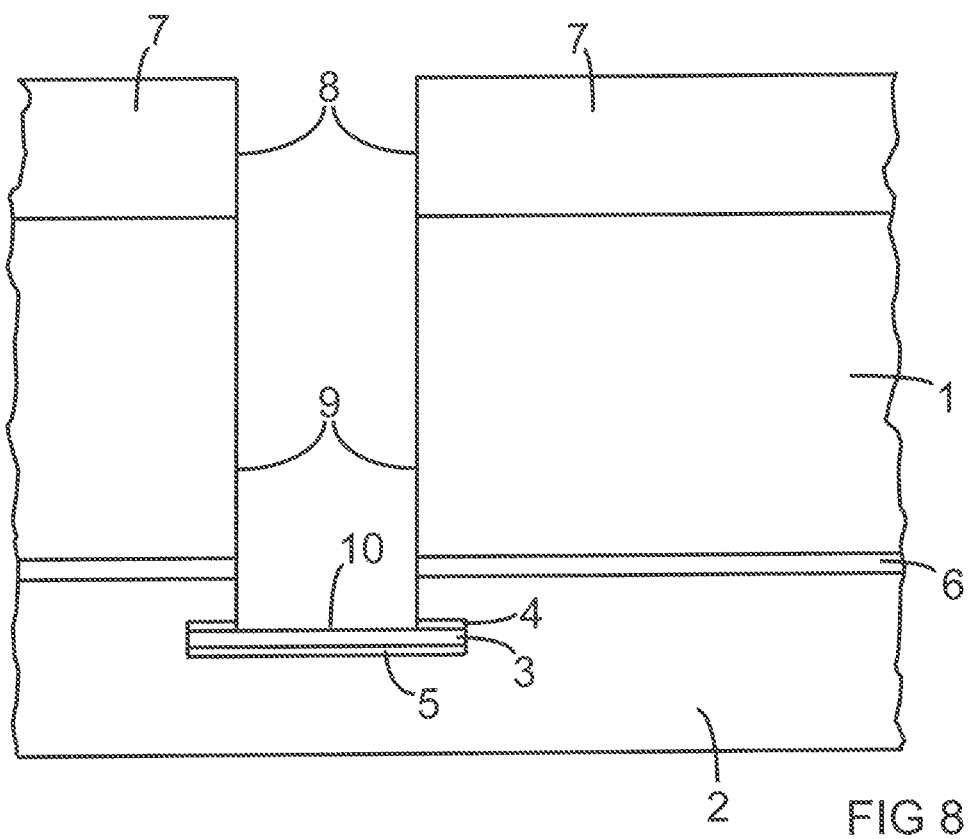
FIG. 8 is a cross section according to FIG. 7 after the via hole is etched.

FIG. 8 is a cross section according to FIG. 7 and shows a further intermediate product after the formation of a via hole 9. The via hole 9 is etched in the substrate 1 through the opening 8 of the mask 7. It is an essential feature of this variant of the method that etching is continued through the dielectric 2, 6 until the metal layer 3 is reached. The mask 7 is still present while the dielectric 2, 6 is etched. Owing to a modification of the chemical environment by the material of the mask 7, polymers that are formed in the course of the etching process may be more easily removed while the mask 7 is still present.

The metallic layer 4 may be used as an etch stop layer terminating the etching of the dielectric 2, 6. Instead, the etching can be continued to reach the metallic layer 4. This means that the etching process need not be selective with respect to the material of the metallic layer 4. Hence the etching recipe can be selected in view of low polymerization.

In any case the metallic layer 4 is removed from the bottom of the via hole 9 in order to expose a contact area 10 of the surface of the metal layer 3. Some material of the metal layer 3 may also be removed in this step without adversely affecting the further process steps and, in particular, the electric contact that is later formed on the metal layer 3.

Figure 9:
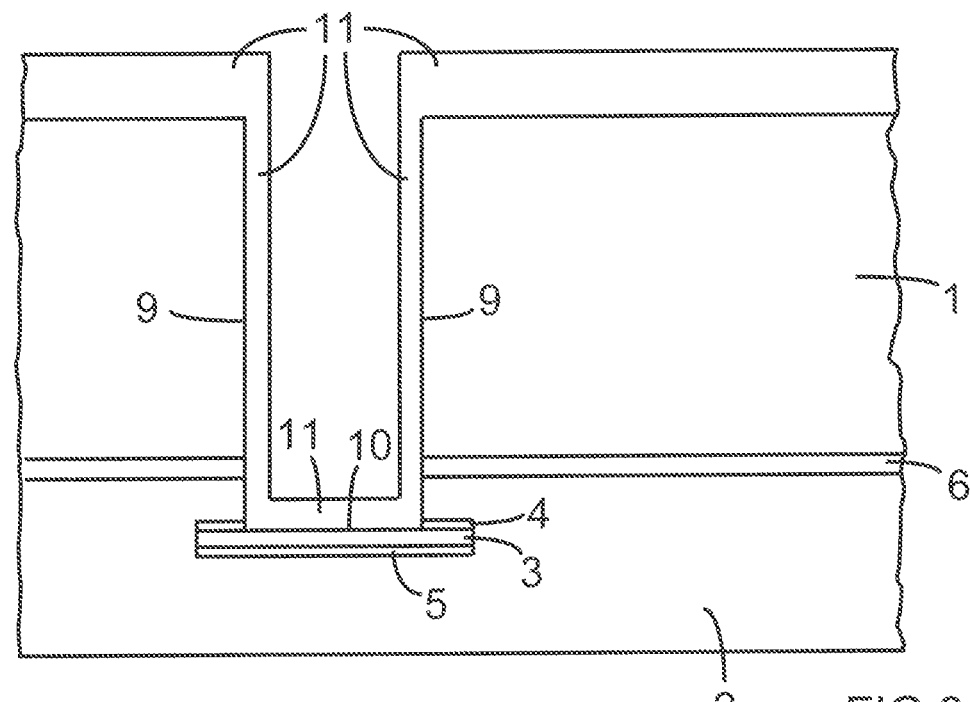
FIG. 9 is a cross section according to FIG. 8 after an application of an insulation layer.

FIG. 9 is a cross section according to FIG. 8 and shows a further intermediate product after an application of an insulation layer 11. The insulation layer 11, which may be silicon oxide, for instance, is provided as an insulation between the semiconductor material of the substrate 1 and the metallization that will later be applied to form the electrically conductive part of the through-substrate via. The insulation layer 11 may be applied by deposition, for example. Portions of the insulation layer 11 typically also cover the contact area 10 of the metal layer 3 and the backside of the substrate 1 outside the via hole 9.

Figure 10:
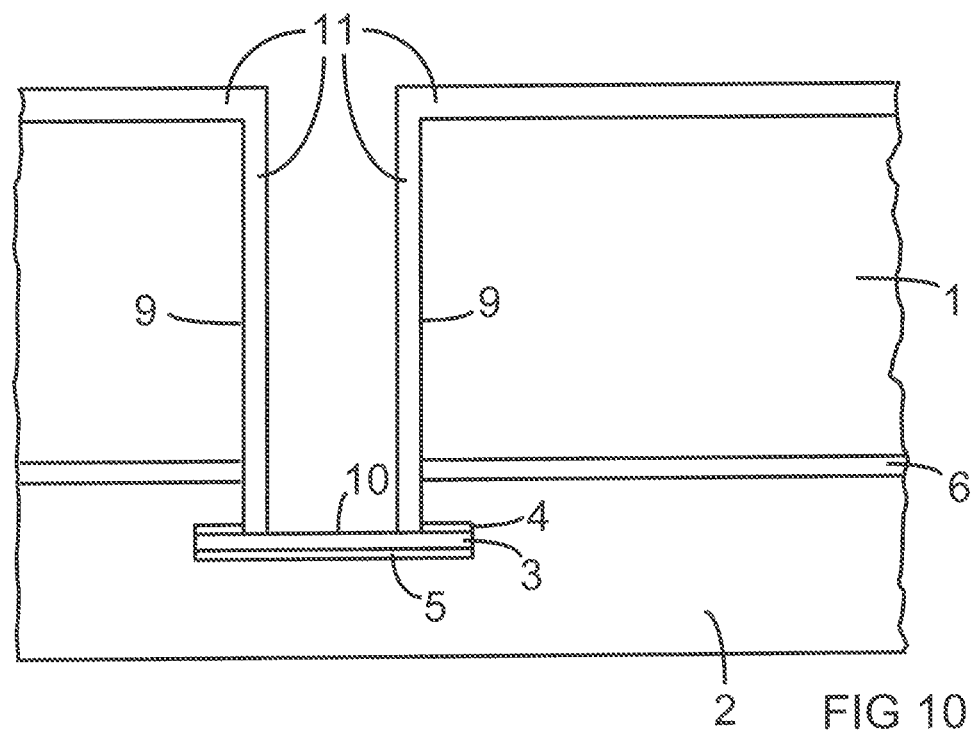
FIG. 10 is a cross section according to FIG. 9 after the insulation layer is removed from the bottom of the via hole.

FIG. 10 is a cross section according to FIG. 9 and shows a further intermediate product after a partial removal of the insulation layer 11. An anisotropic etching process is applied to remove the insulation layer 11 from the bottom of the via hole 9, so that the contact area 10 of the metal layer 3 is again exposed. The etching recipe can again be selected in view of low polymerization. The portion of the insulation layer 11 that is applied outside the via hole 9 may be completely removed. Instead, as shown in FIG. 10 by way of example, the backside of the substrate 1 may still be covered by the insulation layer 11.

Figure 11:
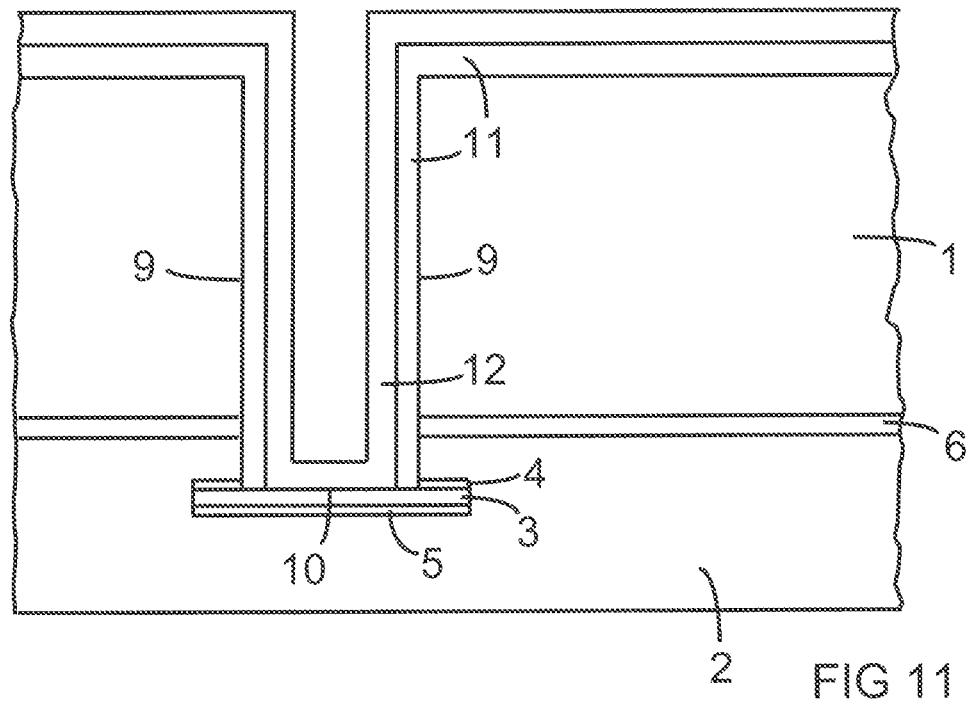
FIG. 11 is a cross section according to FIG. 10 after an application of a metallization.

FIG. 11 is a cross section according to FIG. 10 and shows a further intermediate product after an application of a metallization 12, which is provided for the electrically conductive part of the through-substrate via. The metallization 12 can be applied as described above, especially as a sequence of metal layers, which may include titanium and tungsten layers, for instance. In this variant of the method the metallization 12 is separated from the remaining portion of the metallic layer 4 by the bottom of the insulation layer 11.

Figure 12:
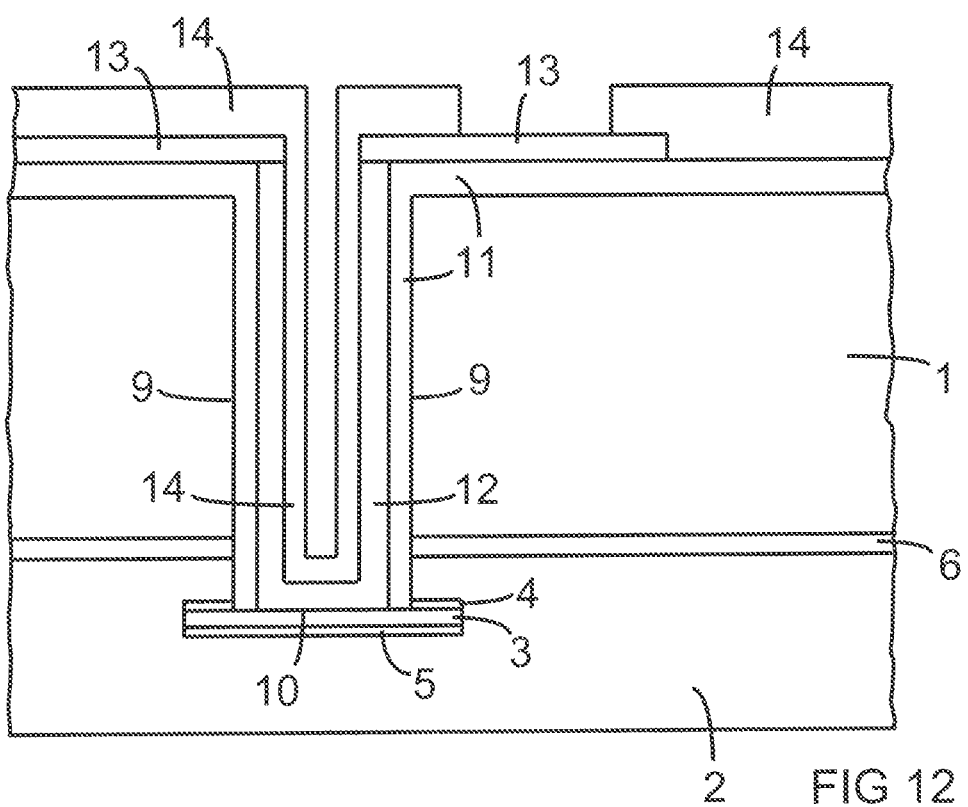
FIG. 12 is a cross section according to FIG. 11 after an application of a top metal.

FIG. 12 is a cross section according to FIG. 11 after further process steps. The metallization 12 is optionally removed from the backside of the substrate 1, and a top metal 13 may be applied on the backside in contact with the metallization 12 and provided with a cover layer 14, as described above.

The variant of the method according to FIGS. 7 to 12 has the advantages that the metal layer 3 can be used as an etch stop layer and the metallic layer 4 is removed from the contact area 10 before the insulation layer 11 is applied. Hence there is no risk that the metallic layer 4 becomes porous during a wet cleaning step, which is required after etching. In this way the applied cleaning agent is prevented from penetrating and attacking the surface of the metal layer 3. As a result, the contact area 10 is sufficiently smooth for the metallization 12 to be applied, even if the metallic layer 4 is made as thin as desired for a wiring of a CMOS device, for example. The etching of the dielectric 2, 6 and the etching of the insulation layer 11 can separately be optimized. The etching recipe can be selected for low polymerization to facilitate the cleaning steps.

FIGS. 13 to 17 are cross sections according to FIGS. 2 to 6 for a further variant of the method, which starts with an intermediate product according to FIG. 1. The corresponding elements are designated with the same reference numerals.

Figure 13:
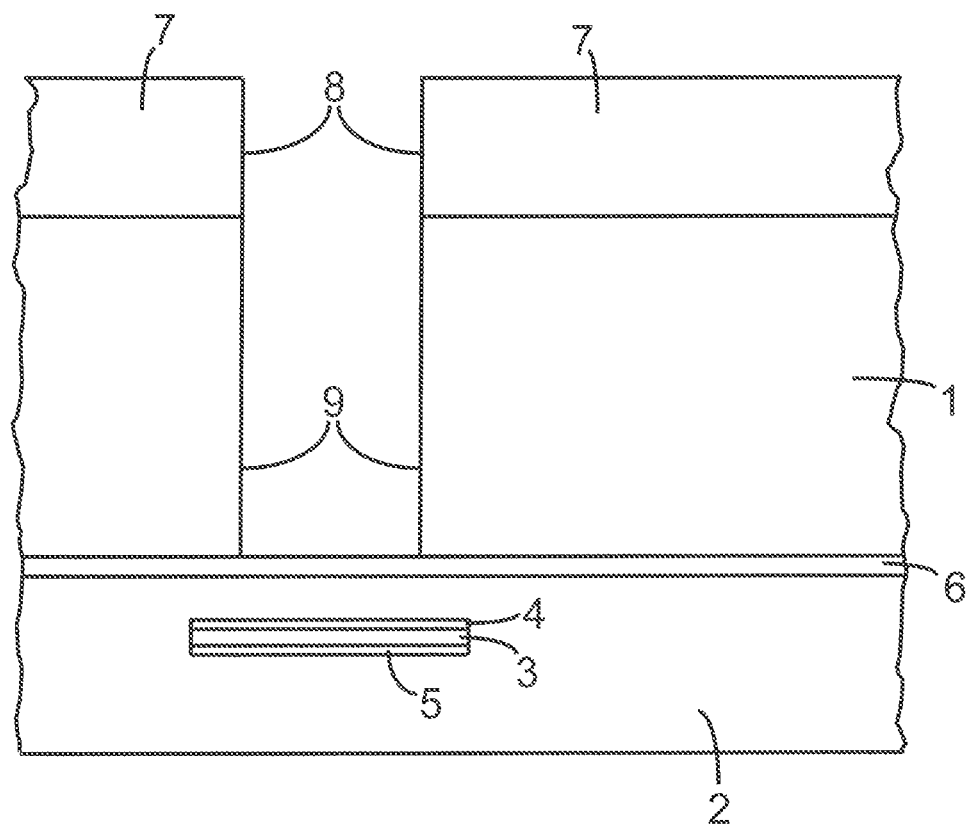
FIG. 13 is a cross section according to FIG. 2 for an alternative method after the via hole is etched.
Figure 14:
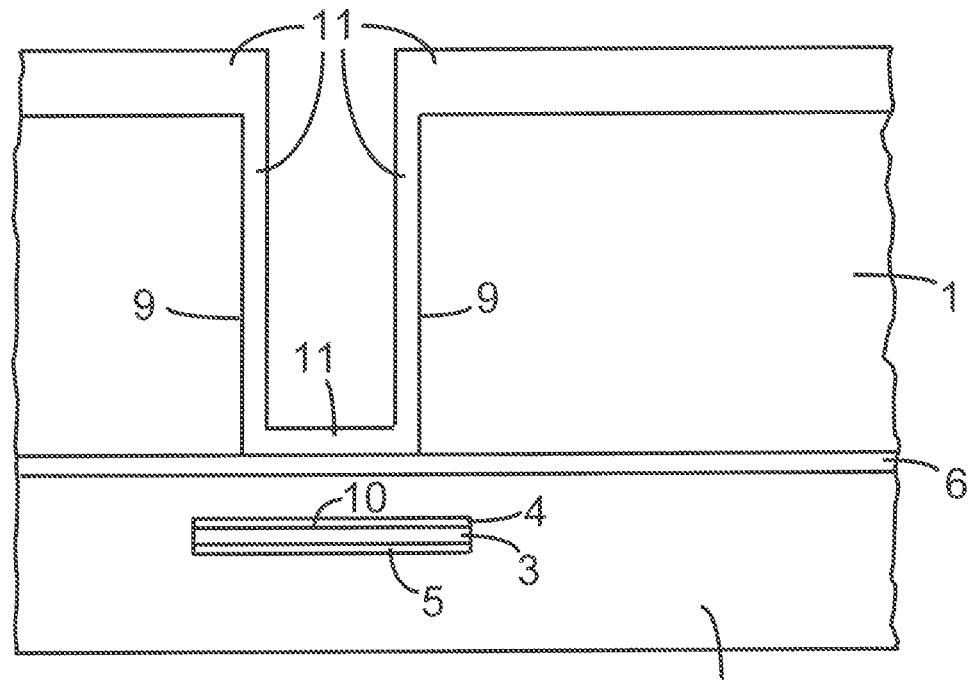
FIG. 14 is a cross section according to FIG. 13 after an application of an insulation layer.
Figure 15:
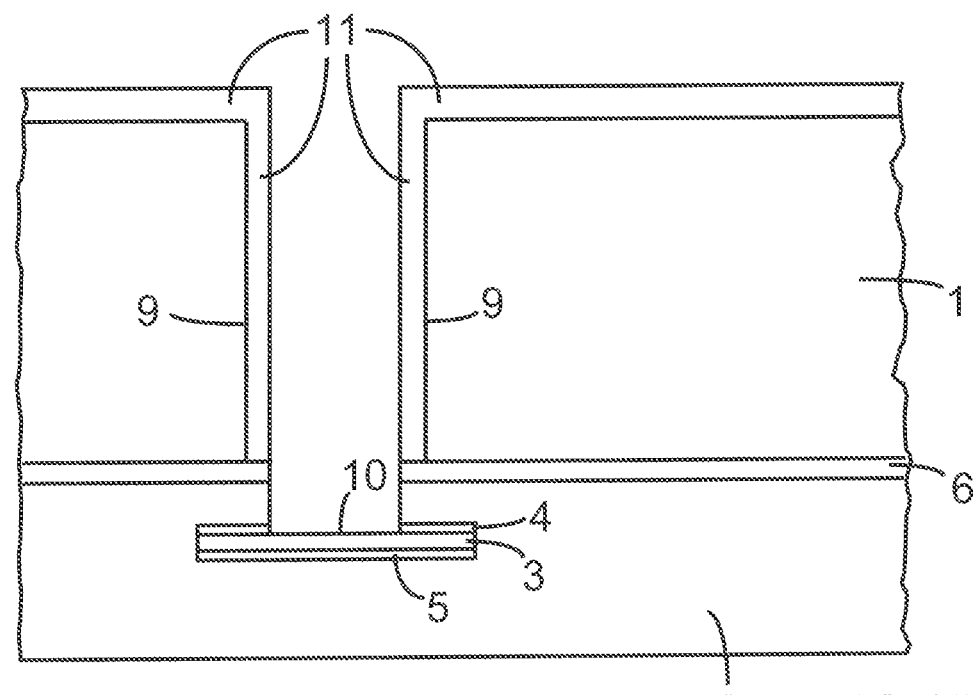
FIG. 15 is a cross section according to FIG. 14 after the insulation layer is removed from the bottom of the via hole.

FIG. 13 shows that the substrate 1 is etched until the further dielectric 6 is reached. Then the insulation layer 11 is applied as shown in FIG. 14. Then an anisotropic etching step, which may be reactive ion etching, is performed through the bottom of the insulation layer 11, the further dielectric 6, the dielectric 2 and the metallic layer 4. The result of the etching is shown in FIG. 15. A portion of the metallic layer 4 remains between the metal layer 3 and the insulator, which comprises portions of the dielectric 2 and the further dielectric 6 as well as the insulation layer 11.

Figure 16:
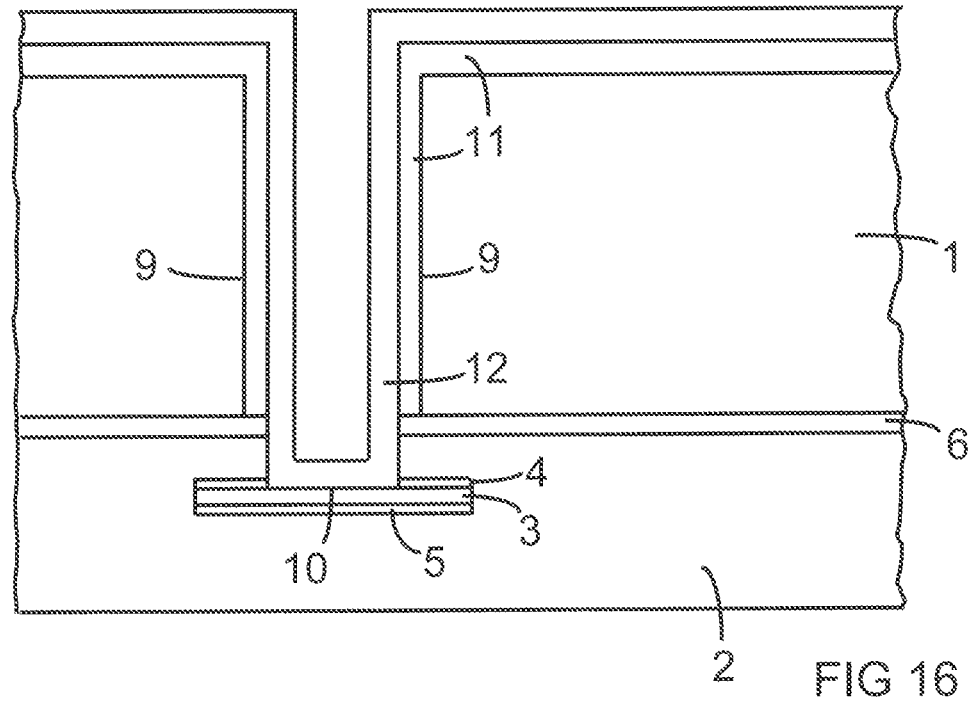
FIG. 16 is a cross section according to FIG. 15 after an application of a metallization.
Figure 17:
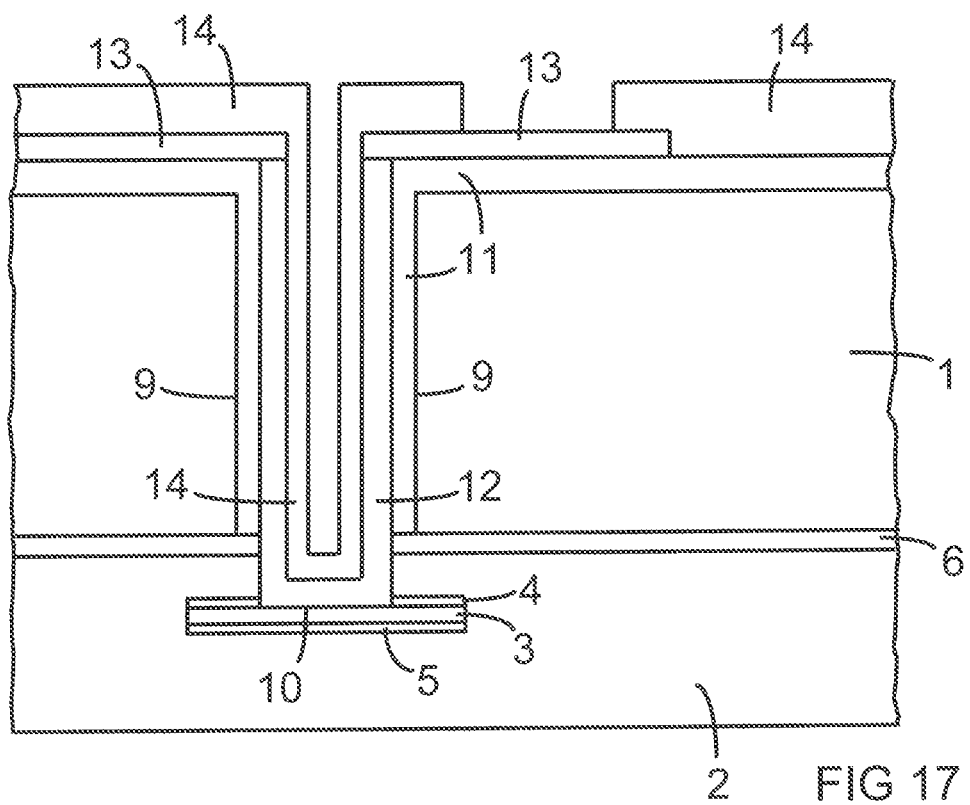
FIG. 17 is a cross section according to FIG. 16 after an application of a top metal.

In this variant of the method the lower part of the insulation is not formed by the insulation layer 11, but by portions of the dielectric 2 and the further dielectric 6. This has the advantage that the eventually remaining portion of the metallic layer 4 is always covered with insulating materials. The further steps of this variant of the method are similar to the method steps described above in conjunction with FIGS. 5 and 6 and are shown in FIGS. 16 and 17.

The invention claimed is:

1. A method of forming a through-substrate via, comprising:
providing a substrate with a dielectric arranged on the substrate, a metal layer embedded in the dielectric, and a metallic layer arranged on the metal layer, the metallic layer being disposed between the substrate and the metal layer,
forming a via hole penetrating the substrate above the metal layer;
removing the dielectric from above the metallic layer so that the via hole reaches the metallic layer;
applying an insulation layer in the via hole and on the metallic layer after removing the dielectric;
removing the insulation layer from above a contact area of the metal layer such that a portion of the metallic layer is left between the metal layer and the insulation layer; and
applying a metallization in the via hole, the metallization contacting the metal layer in the contact area and being insulated from the substrate by the insulation layer, wherein
the metallic layer is completely removed from the contact area before the metallization is applied.

2. The method of claim 1, wherein
the metal layer comprises a material that is different from the material of the metallic layer.

3. The method of claim 1, wherein
the metallic layer comprises titanium or aluminum.

4. The method of claim 1, wherein
the metallic layer comprises a nitride.

5. The method of claim 1, wherein
the dielectric is removed from above the metal layer by etching and by using a recipe that is non-selective with respect to the metallic layer.

6. The method of claim 1, wherein
the metal layer is aluminum.

7. The method of claim 1, wherein
the dielectric and the insulation layer are removed from above the metal layer by etching, and in each of these etching steps the same etching recipe is used.

8. The method of claim 1, further comprising:
before forming the via hole, applying a mask with an opening;
etching the via hole through the opening; and
removing the mask before the insulation layer is applied.

9. A semiconductor device, comprising:
a substrate with a through-substrate via;
a via hole of the through-substrate via;
an insulation layer in the via hole;
a metallization of the through-substrate via, the insulation layer insulating the metallization from the substrate;
a metal layer above the substrate, the metallization contacting the metal layer; and
a metallic layer on the metal layer, the metallic layer being arranged between the substrate and the metal layer, the metallic layer comprising a material that is different from the material of the metal layer, wherein
a portion of the metallic layer is arranged between the metal layer and the insulation layer and is in physical contact with the insulation layer, and
the metallization is in physical contact with a contact area of the metal layer.

10. The semiconductor device according to claim 9, wherein the metallic layer comprises titanium or aluminum.

11. The semiconductor device according to claim 9, wherein the metallic layer comprises a nitride.

\* \* \* \* \*